United States Patent
Sharpe-Geisler

[11] Patent Number: 5,986,480
[45] Date of Patent: Nov. 16, 1999

[54] MULTIPLE INPUT ZERO POWER AND/NOR GATE FOR USE IN A FIELD PROGRAMMABLE GATE ARRAY (FPGA)

[75] Inventor: Bradley A. Sharpe-Geisler, San Jose, Calif.

[73] Assignee: Advanced Micro Devices, Inc., Sunnyvale, Calif.

[21] Appl. No.: 08/996,119

[22] Filed: Dec. 22, 1997

[51] Int. Cl.⁶ .................................................... H03K 19/94
[52] U.S. Cl. .............................. 326/119; 326/121; 326/50
[58] Field of Search ................................. 326/82, 83, 86, 326/112, 119, 121, 39, 49–50

[56] References Cited

U.S. PATENT DOCUMENTS 5,661,415  8/1997  Aoki et al. .................................. 326/86
5,825,206 10/1998  Krishnamurphy et al. ............... 326/86

*Primary Examiner*—Jon Santamauro
*Assistant Examiner*—Don Phu Le
*Attorney, Agent, or Firm*—Fliesler, Dubb, Meyer & Lovejoy

[57] ABSTRACT

A zero power AND or NOR (AND/NOR) gate includes circuitry configured for use in a field programmable gate array (FPGA). The AND/NOR gate includes multiple driver circuits each receiving a single input of the AND/NOR gate, each driver circuit being connected by a NORCNTL line and a NOROUT line to a current switch circuit. The NOROUT line provides the output of the AND/NOR gate, while the NORCNTL line enables zero power operation. The driver circuits can be included in input/output buffers (IOBs), configurable logic blocks (CLBs), or other components throughout an FPGA to receive more inputs than typically provided to a single CLB. Each of the driver circuits includes a pull down transistor having a gate receiving an input signal ($IN_1$–$IN_N$) of the AND/NOR gate, and having a source to drain path connecting the NOROUT line to Vss. The current switch circuit includes a current source and a current control transistor with a source to drain path connecting the current source to the NOROUT line, and a gate coupled by the NORCNTL line to the driver circuits. Additional circuitry in each of the driver circuits controls the NORCNTL line to enable the current control transistor to turn on for a predetermined period of time when an input signal ($IN_1$–$IN_N$) is applied to a driver circuit to turn off its respective pull down transistor.

22 Claims, 5 Drawing Sheets

MULTIPLE INPUT ZERO POWER AND/NOR GATE FOR USE IN A FIELD PROGRAMMABLE GATE ARRAY (FPGA)

BACKGROUND OF THE INVENTION

1. Field of the Invention

The present invention relates generally to circuitry which may be used in field programmable gate arrays (FPGA), and more particularly to circuitry for zero power AND or NOR gates.

2. Description of the Related Art

FIG. 1 illustrates typical PLD circuitry. As shown, the PLD has multiple inputs ($I_0$–$I_2$), each connectable to one of a series of AND gates. The output of each AND gate then provides a product term. The actual components used in the PLD are NOR gates, but by inverting the inputs to the NOR gate circuitry, the AND gates of FIG. 1 can be formed. The output of the AND gates are connected through OR gates to provide outputs for the PLD. The outputs of the PLD are further fed back through a register to provide additional inputs for the AND gates. Although a limited number of inputs to the AND gates are shown in FIG. 1, a typical PLD provides approximately fifty inputs to a single AND gate enabling the PLD to have a wide decoding capability.

FIG. 2 illustrates components typically included in an FPGA. As shown, the typical FPGA includes input/output buffers (IOBs), an array of configurable logic blocks (CLBs), resources for interconnection of the CLBs, and a configuration memory. The IOBs are arranged around the perimeter of the device and provide an interface between internal components of the FPGA and external package pins. Resources for interconnection of the CLBs include interconnect lines, programmable interconnect points (PIPs) and switch matrixes made up of PIPs. Inputs and outputs of a CLB are connectable to other CLBs, or to IOBs using the interconnect lines and switch matrixes. PIPs as well as the switch matrixes are programmed to make connections by bits stored in the configuration memory.

Each of the CLBs in the array include on the order of 4 look up tables. The look up tables are made up of decoding logic addressing a group of memory cells. Each look up table typically receives approximately a 4 bit input and provides a single bit output from a memory cell. Although each look up table can be programmed to form an AND gate or NOR gate, with only 4 inputs to each look up table the decoding ability at each stage in an FPGA is very limited as compared with a PLD which has potentially hundreds of inputs connected to a single AND gate.

SUMMARY OF THE INVENTION

The present invention provides circuitry for an AND or NOR (AND/NOR) gate which can be distributed throughout an FPGA, such as in the IOBs or in the CLBs, to provide an AND/NOR gate receiving significantly more inputs than are typically provided to a look up table of a single CLB. Using the AND/NOR gate of the present invention enables an FPGA to provide a wide decoding function similar to a PLD.

The present invention further enables the AND/NOR gate to be a zero power device.

The AND/NOR gate of the present invention includes multiple driver circuits and a single current switch circuit. The driver circuits each receive a single input of the AND/NOR gate and are connected by a NORCNTRL line and a NOROUT line to the current switch circuit. The NOROUT line provides the output of the AND/NOR gate, while the NORCNTRL line serves to enable zero power operation. As configured, the driver circuits can be included in different configurable logic blocks (CLBs) throughout an FPGA to receive the limited number of inputs typically provided to a CLB, the driver circuits together functioning to form one large AND/NOR gate receiving many inputs.

Each of the driver circuits includes a pull down transistor having a gate receiving an input signal ($IN_1$–$IN_N$) of the AND/NOR gate, and having a source to drain path connecting the NOROUT line to Vss. The current switch circuit includes a first current source and a current control transistor with a source to drain path connecting the current source to the NOROUT line, and a gate coupled by the NORCNTRL line to the driver circuits. Additional circuitry in each of the driver circuits and the current switch circuit controls the NORCNTRL line to enable the current control transistor to turn on for a predetermined period of time when an input signal ($IN_1$–$IN_N$) is applied to a driver circuit to turn off its respective pull down transistor. After the predetermined period, circuitry controls the NORCNTRL line to turn off the current control transistor so that current does not continue flowing from the first current source if one of the pull down transistors in a driver circuit is still turned on to maintain zero power operation.

The current switch circuit further includes two series inverters forming a buffer coupling the gate of the current control transistor to the NORCNTRL line. A second current source is also included in the current switch circuit to connect to the NORCNTRL line.

Each driver circuit further includes: CMOS pass transistors having a source to drain path connecting the NORCNTRL line to the NOROUT line; a NOR gate having a first input coupled to receive the input ($IN_1$–$IN_N$) of the driver circuit, and a second input connected to the NORCNTRL line; a latch having an input connected to the output of the NOR gate; and a NAND gate having a first input connected to the output of the latch, a second input coupled to receive the input ($IN_1$–$IN_N$) of the driver circuit, and an output coupled to gates of the CMOS pass transistors.

BRIEF DESCRIPTION OF THE DRAWINGS

Further details of the present invention are explained with the help of the attached drawings in which.

DETAILED DESCRIPTION

Figure 1:
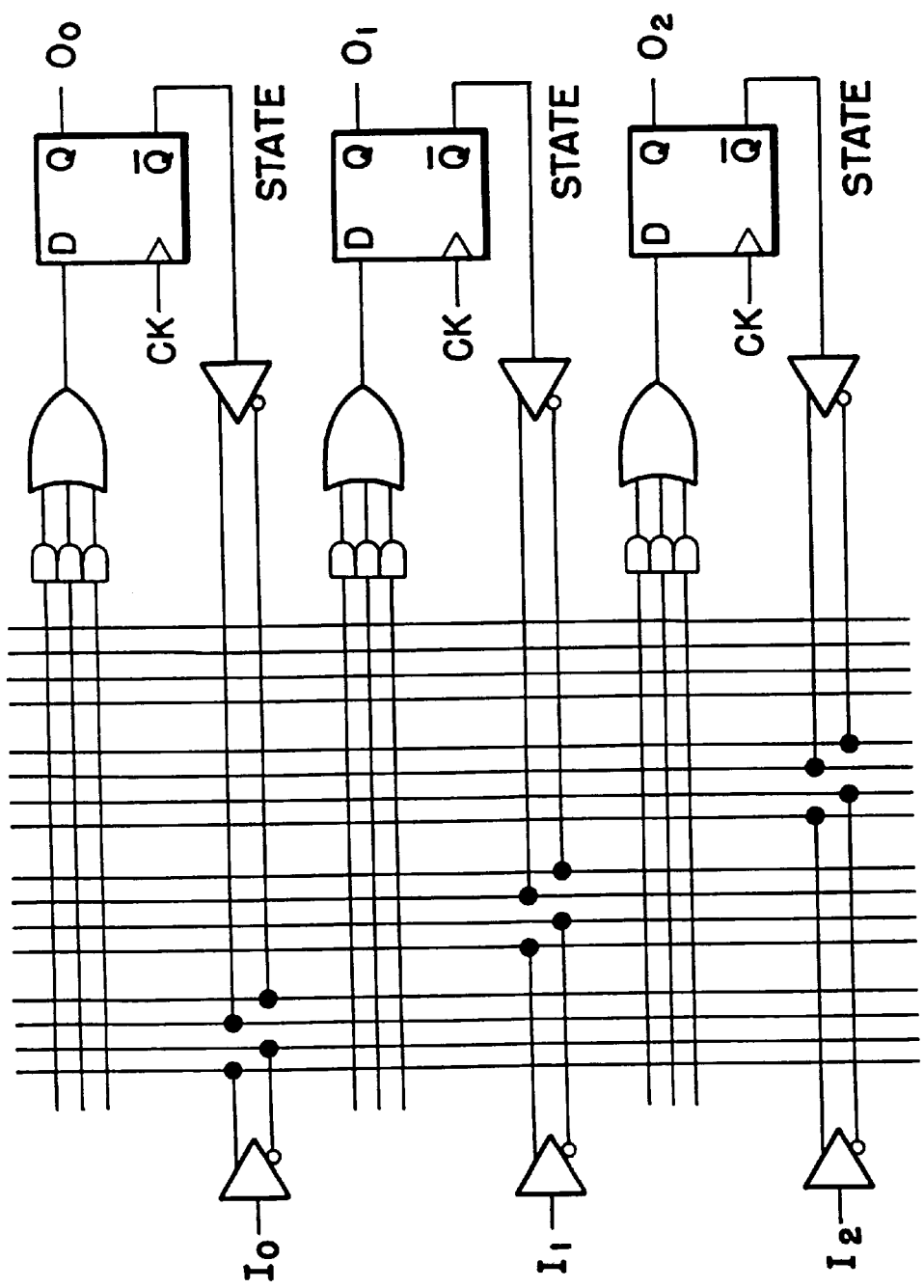
FIG. 1 shows typical PLD circuitry.
Figure 2:
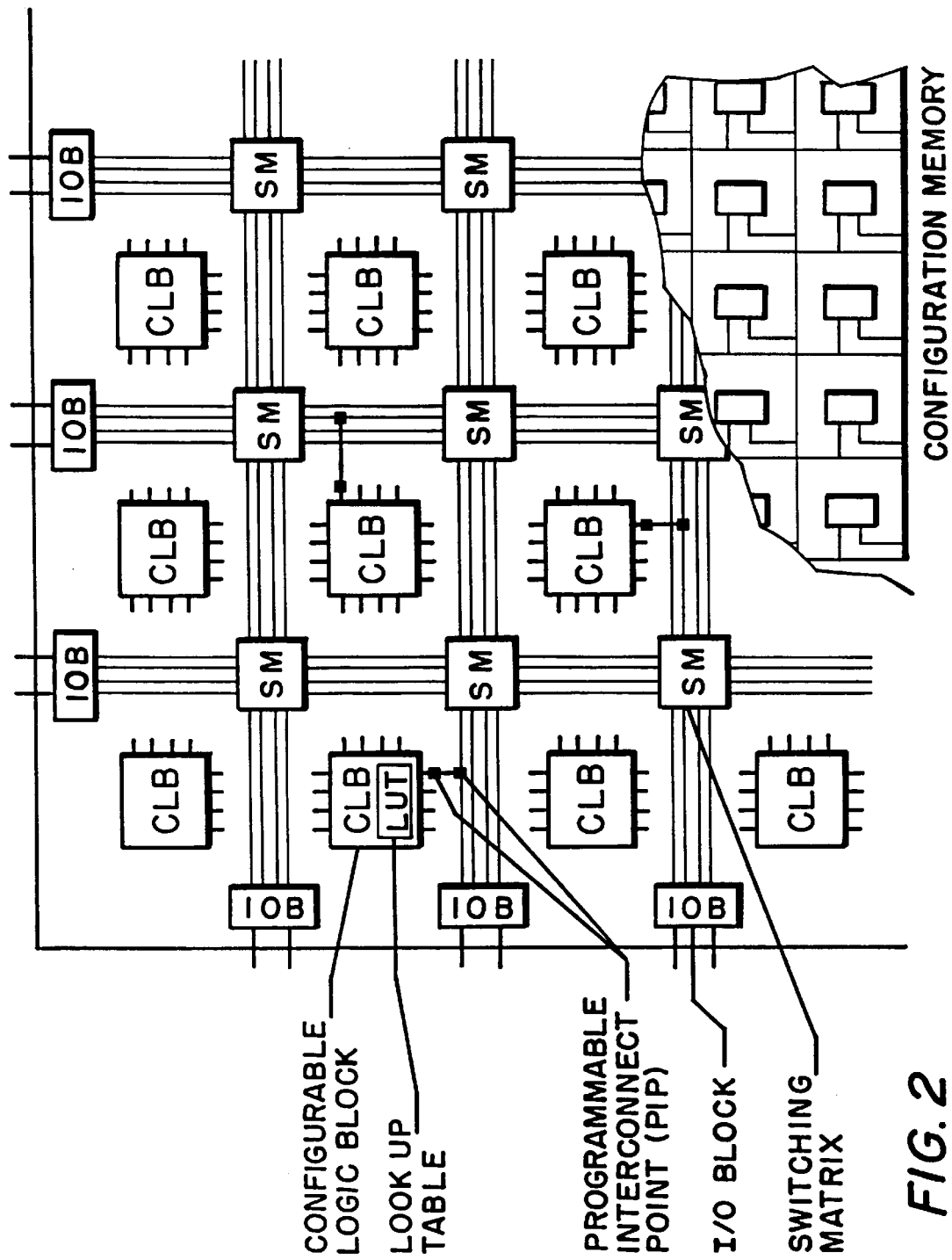
FIG. 2 shows typical FPGA circuitry.
Figure 3:
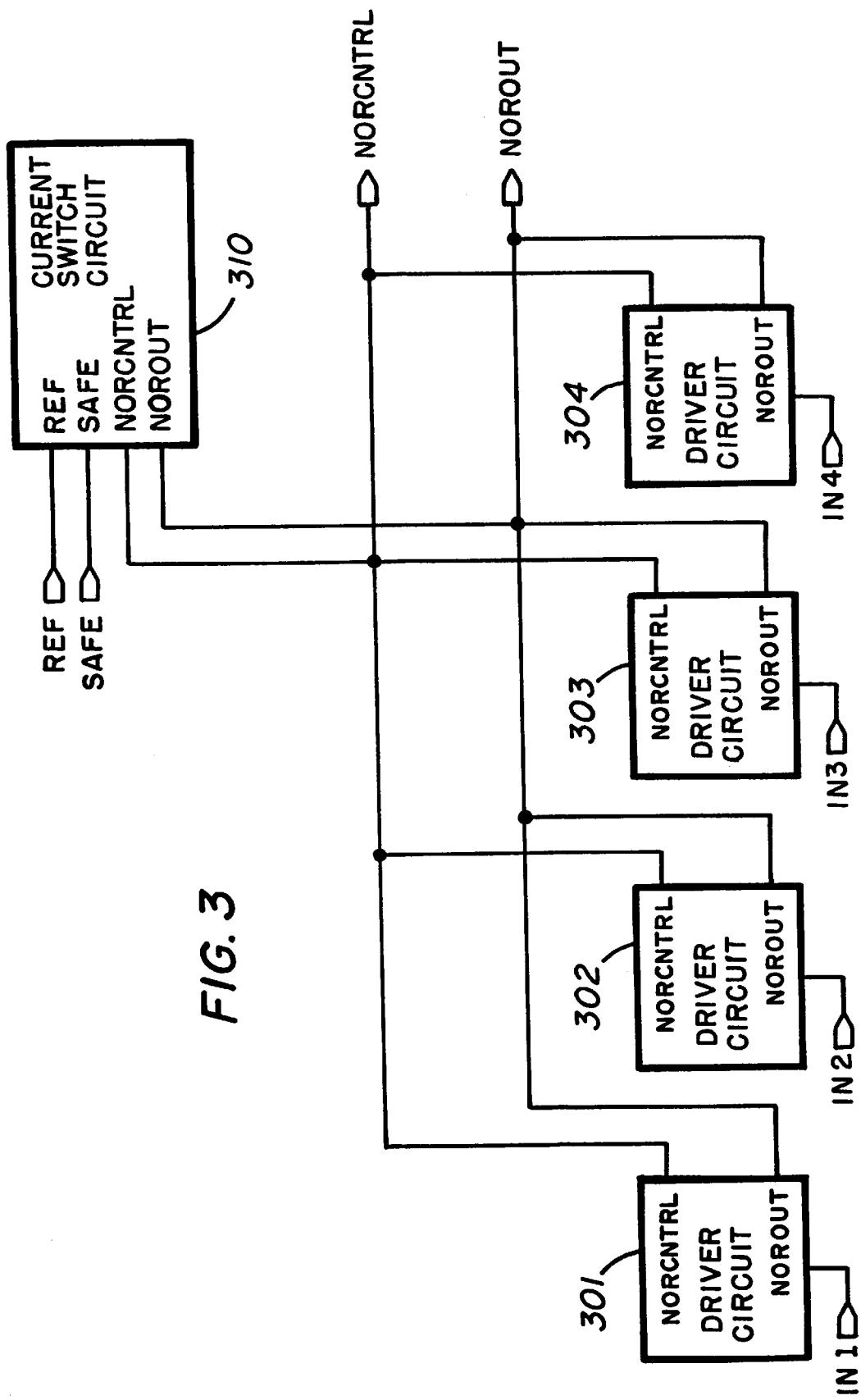
FIG. 3 is a block diagram of components for the AND/NOR gate of the present invention.

FIG. 3 is a block diagram of components for a multiple input, or wide AND/NOR gate of the present invention. The AND/NOR gate includes multiple driver circuits 301–304 and a current switch circuit 310. Each driver circuit 301–304 receives one input IN1–IN4 provided to the AND/NOR gate. Each driver circuit 301–304 is connected to all other driver circuits through a pair of lines NOROUT and NORCNTRL. The NOROUT line provides the output of the overall AND/NOR gate similar to a product term from an AND gate of a PLD, as described previously. The NORCNTRL line supplies current to the driver circuits 301–304 enabling the overall circuit to operate in a zero power mode. The two lines NOROUT and NORCNTRL are further connected to the current switch circuit 310, the current switch circuit 310 functioning to control current to provide zero power operation.

When utilized in an FPGA, the driver circuits 301–304 can each be included in different IOBs, CLBs, or throughout other areas of the FPGA. The current switch circuit 310 can also be included in any desired area of the FPGA. Note that although four driver circuits 301–304 are shown in FIG. 3, many more can be included. Further in an FPGA, the NOROUT and NORCNTRL lines can be provided using interconnect lines of the FPGA. With such a configuration, wide decoding can be provided in an FPGA, similar to a PLD.

Figure 4:
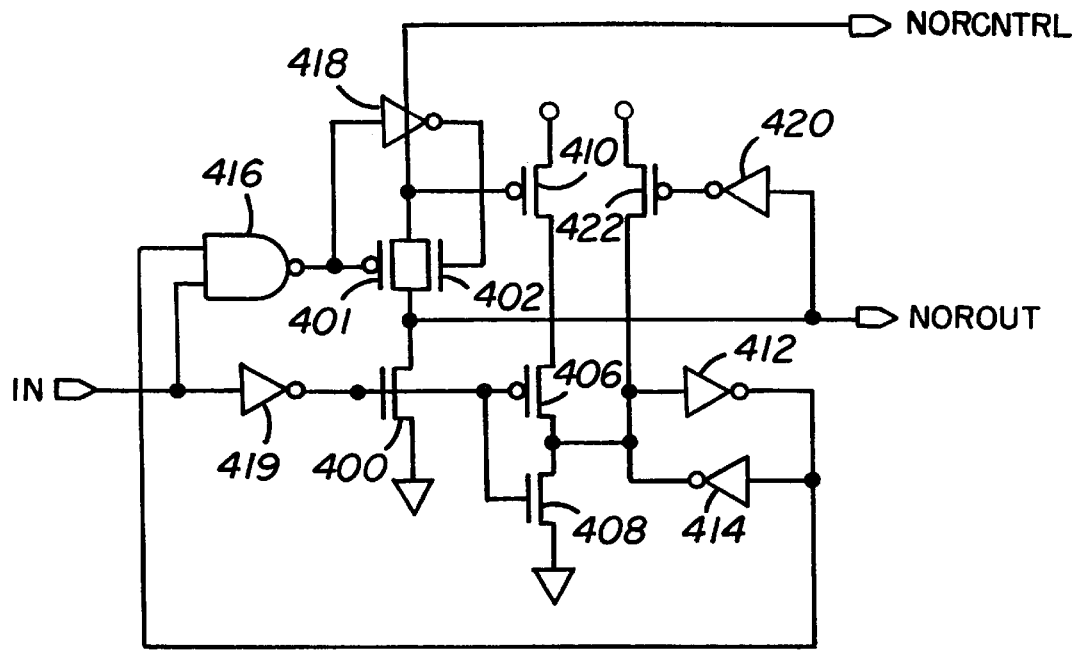
FIG. 4 shows circuitry for each of the driver circuits of FIG. 3.

FIG. 4 shows circuitry for each of the driver circuits 301–304 of FIG. 3. In FIG. 4, an inverter 419 couples an input signal IN to the gate of a transistor 400. Transistor 400 has a source to drain path connecting the NOROUT line to Vss. Further, a CMOS pass gate made up of a PMOS transistor 401 and an NMOS transistor 402 with source to drain paths connected in parallel couples the NORCNTRL line to the NOROUT line. Note that in FIG. 4, as well as other figures, PMOS transistors, such as transistor 401, have a gate circle, while NMOS transistors, such as transistor 402 do not.

The circuit of FIG. 4 further includes a NOR gate made up of PMOS transistors 406 and 410 and NMOS transistor 408. PMOS transistor 410 has a source connected to Vdd, and a gate providing a first input of the NOR gate connected to the NORCNTRL line. PMOS transistor 406 has a source connected to the drain of transistor 410, a gate providing a second input of the NOR gate connected to the output of inverter 419, and a drain providing the output of the NOR gate. NMOS transistor 408 has a drain connected to the drain of transistor 406, a source connected to Vss, and a gate connected to the gate of transistor 406.

The circuit of FIG. 4 further includes a latch made up of inverters 412 and 414. The input of latch 412, 414 is connected to the output of the NOR gate formed by the drains of transistors 406 and 408. The output of latch 412,414 is connected to one input of a NAND gate 416. A second input of NAND gate 416 receives the IN signal. The output of NAND gate 416 is provided directly to the gate of transistor 401, and through an inverter 418 to the input of transistor 402.

The circuit of FIG. 4 further includes an inverter 420 connecting the NOROUT line to the gate of a PMOS transistor 422. The source to drain path of transistor 422 connects Vdd to the input of inverter 412,414.

Figure 5:
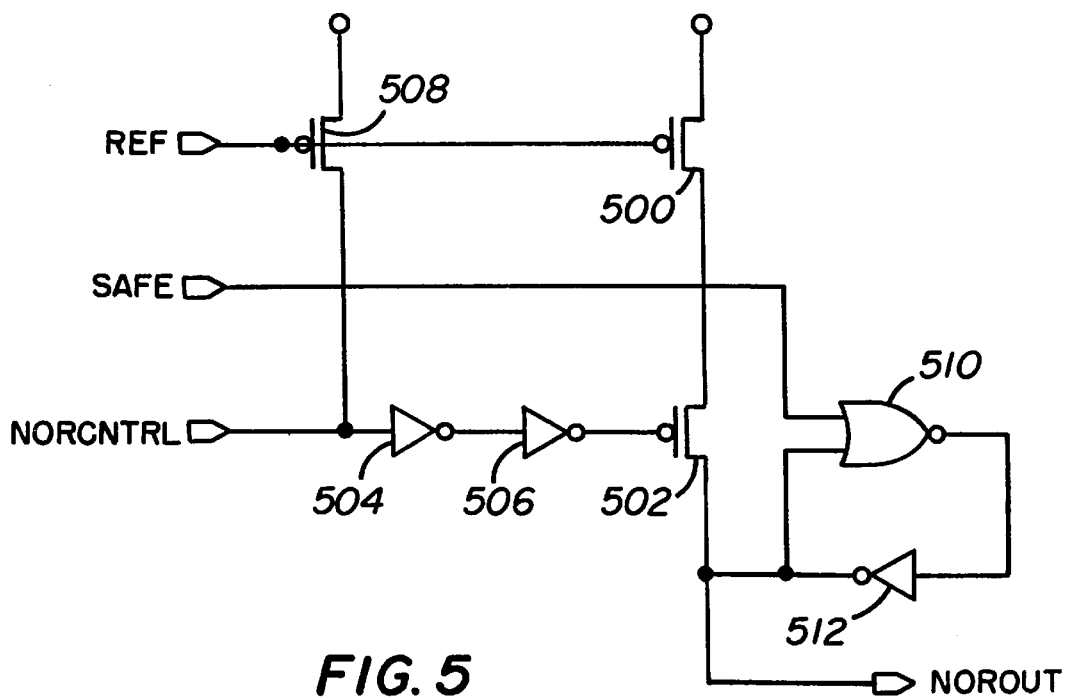
FIG. 5 shows circuitry for the current switch circuit of FIG. 3.

FIG. 5 shows circuitry for the current switch circuit 310 of FIG. 3. The circuit of FIG. 5 includes a first current source transistor 500 having a gate connected to a voltage reference REF, a source connected to Vdd, and a drain connected to the source of a PMOS current control transistor 502. The drain of current control transistor 502 is connected to the NOROUT line, while its gate is coupled to the NORCNTRL line through series connected inverters 504 and 506. A second current source 508 has a source to drain path connecting Vdd to the NORCNTRL line, and a gate connected to the reference REF.

The circuit of FIG. 5 further includes a NOR gate 510 having a first input which receives a SAFE signal. The SAFE signal is applied in a high state during power up to enable the initial output state of particular components on a chip to be controlled to prevent errors. A second input of NOR gate 510 is connected to the NOROUT line. The output of NOR gate 510 is coupled to the NOROUT line by inverter 512. Operation of the circuitry of FIGS. 3–5 is described in detailed below with the circuitry functioning as an AND gate. Note that operation as a NOR gate can be provided by inverting the inputs provided to the driver circuits 301–304.

I. Operation With IN1 Low And IN2–IN4 High

In operation the state of the input IN1 is initially assumed to be low, while the state of inputs IN2–IN4 is initially assumed to be high. Note that for a 4-input AND gate with one input low, the output will likewise be low. Thus, it is desirable for the NOROUT line to have a low state if IN1 is low.

With IN1 low the inverter 419 for the driver circuit 301 will go high to turn on transistor 400. Transistor 400 will then pull the NOROUT line low. With IN1 low, the output of NAND gate 416 will be high to turn off the CMOS pass gate made up of transistors 401–402. With inverter 419 providing a high output, transistor 408 will turn on to pull the input of latch 412,414 low. The output of latch 412,414 will, thus, provide a high to NAND gate 416, so that when IN1 later transitions from low to high, the NAND gate 416 will provide a low output to turn on CMOS pass gate 401–402.

With IN2–IN4 high in driver circuits 301–304, inverter 419 as shown in FIG. 4 for those driver circuits will provide a low output to turn off transistors 400 and 408. Because each of IN2–IN4 are high, the state of the output of NAND gate 416 in those driver circuits is dependent on the state of latch 412,414. Operation is analyzed below with the latch 412,414 first assumed to provide a high output, and then to provide a low output.

A. Latch 412,414 With High Output

With latch 412,414 having a high output and IN high, NAND gate 416 will provide a low to turn on the transistors of CMOS pass gate 401–402. Current through the source to drain path of transistors 401 and 402 is driven by the NORCNTRL line, and in particular the second current source transistor 502 of the current switch circuit 310. However, transistor 400 of the driver circuit is turned on to pull NOROUT low, and is sized to draw more current than supplied by transistor 508, so NORCNTRL will be pulled low.

With NORCNTRL low, the series inverters 504 and 506 of FIG. 5 will pull the gate of the current control transistor 502 of FIG. 5 low to turn on transistor 502 and provide current from current source 500 to drive NOROUT. However, transistor 400 is still sized to be stronger than current source 500 in combination with current source 508, so transistor 400 will maintain both NOROUT and NORCNTRL low. With NORCNTRL low, transistor 410 of each of the driver circuits 301–304 will turn on to pull up the input of latch 412,414. Latch 412,414 will then reset to provide a high output to the NAND gate 416, causing the output of NAND gate 416 to go high. The CMOS pass gate 401–402 of each of the driver circuits 301–304 will, thus, turn off to stop current flow from the NORCNTRL line to the NOROUT line.

With current flow through all CMOS pass gates 401–402 stopped, pull up transistor 508 of the current switch circuit of FIG. 5 will pull NORCNTRL high, serie NORCNTRL high, series inverters 504 and 506 will pull the gate of transistor 502 high to turn off transistor 502 to cut off current from current source 500 through the NOROUT line to transistor 400 to maintain a zero power mode of operation.

With transistor 400 of the driver circuit 301 on, NOROUT will remain low. With NOROUT low, inverter 420 in all the driver circuits 301–304 will provide a high output to turn off transistor 422. Further with NORCNTRL being high, transistor 410 will turn off in all of driver circuits 301–304 to assure the entire circuit draws zero power.

B. Latch 412,414 With Low Output

With latch 412,414 providing a low to NAND gate 416, NAND gate 416 will provide a high irrespective of the states of an input signal IN received at a second input of NAND gate 416. With the NAND gate 416 output high, CMOS pass gate 401–402 will be off to stop current flow from the NORCNTRL line to the NOROUT line. With current flow through all CMOS pass gates 401–402 in driver circuits 301–304 stopped, pull up transistor 508 of the current switch circuit 310 of FIG. 3 will pull NORCNTRL high. With NORCNTRL high, series inverters 504 and 506 will pull the gate of transistor 502 high to turn off transistor 502 to prevent current flow from current source 500 to transistor 400 to maintain zero power operation.

With transistor 400 of the driver circuit 301 on, NOROUT will remain low. With NOROUT low, inverter 420 in all the driver circuits 301–303 will provide a high output to turn off transistors 422. Further with NORCNTRL being high, transistor 410 will turn off in all of driver circuits 301–303 to further assure the entire circuit draws zero power.

II. Operation With IN1 Going Low to High, And IN2–IN4 Remaining High

Operation is next described, referring to FIG. 3, with the state of the input IN1 transitioning from low to high and the state of inputs IN2–IN4 assumed to remain high. Note that for a four input AND gate with all inputs going high, the output will likewise go high. Thus, it is desirable for the NOROUT line to have a high state if IN1–IN4 all go to high.

IN1 going low to high applies highs to both inputs of NAND gate 416 in driver circuit 301 since the output of latch 412,414 is already high with IN1 previously low, as described above. The output of NAND gate 416 will, thus, go low. With NAND gate 416 providing a low, the CMOS pass gate 401–402 will turn on to connect NORCNTRL and NOROUT. With NOROUT initially low due to INI being previously low, series inverters 504 and 506 of the current switch circuit 310 will pull the gate of transistor 502 low to turn on transistor 502 and apply current from current source 500 to pull up the NOROUT and NORCNTRL lines.

With NORCNTRL initially low, transistor 410 in the driver circuits 301–304 will be on. Further, once NOROUT is pulled high, inverter 420 provides a low output to turn on transistor 422. Because IN1 is now high, NMOS transistors 400 and 408 will be turned off and the PMOS transistor 406 will be on in the driver circuit 301. PMOS transistors 410 and 422 will, thus, provide current to pull up the input of latch 412,414 so that latch 412,414 is reset to provide a low output. With the output of latch 412,414 low, the output of NAND gate 419 will go high to high to turn off CMOS pass gate 401–402. The current source 508 will then function to pull up the NORCNTRL line.

Once NORCNTRL is high, series inverters 504 and 506 will turn off pass gate 502. The driver circuit 301 will then drawing zero power Operation of the driver circuits 302–304 with IN2–IN4 remaining high remains the same as discussed previously.

III. Operation When IN1 Goes High To Low With IN2-IN4 High

In the driver circuit 301 when IN1 goes low, CMOS pass gate 401–402 will be off since the output of NAND gate 416 will remain high. When IN1 goes low, the output of inverter 419 will go high to turn on transistor 400 to pull NOROUT low. With the output of inverter 419 low, transistor 408 will be turned on while transistor 406 is turned off to pull down the input of latch 412,414. Latch 412,414 will then be reset to provide a high output. With IN1 low, even though the output of latch 412,414 goes high, NAND gate 416 will be unaffected. With NOROUT low, the inverter 420 will provide a high to turn off transistor 422 and shut off current flow to the input of latch 412,414 to provide zero power operation. Operation is now back at the initial state with IN1 low and IN2–IN4 high and the circuit is operating in a zero power mode.

IV. Operation With IN1 Transitioning From Low To High, With IN2–IN3 High And IN4 Low With IN1 transitioning from low to high and IN4 already being low, operation is similar to when IN1 transitions from low to high and IN2-IN4 are all high, except NOROUT never goes high. With IN1 going high, and the output of latch 412,414 being high since IN1 was previously low, NAND gate 416 will turn on the CMOS pass gate 401–402 in driver circuit 301 to connect NORCNTRL to NOROUT. With NOROUT being pulled low by transistor 400 of driver circuit 304, and transistors 400 and 408 off in driver circuit 301 due to the output of inverter 419 in that driver circuit being low, transistor 410 will turn on to pull node the input of latch 412,414 high and reset latch 412,414. With latch 412,414 resetting, its output will go low to drive the output of NAND gate 416 high and turn off pass gate 401–402. The Current source transistor 508 of the current switch circuit of FIG. 5 will then pull up NORCNTRL. Series inverters 504 and 506 will turn off transistor 502 to prevent current flow from transistor 500 to NOROUT to provide zero power operation.

V. Failsafe Features The current switch circuit of FIG. 5 includes NOR gate 510 and inverter 512 as a failsafe feature to guarantee desired initial conditions during power up, and to assure the NOROUT line state is maintained stable after power up.

During power up, all of IN1–IN4 can initially be high, while the NOROUT can power up in a low state. With all inputs IN1–IN4 of the circuit of FIG. 3 being high, and the circuit functioning as an AND gate, the NOROUT line should be high. The NOR gate 510 and inverter 512 of FIG. 5 assure the NOROUT line is initially high when IN1–IN4 are all initially high.

With SAFE high at power up, IN1–IN4 high and NOROUT low, the output of NOR gate 510 will be low and inverter 512 will provide a high to pull NOROUT to the desired high state. With IN1–IN4 high at power up and NOROUT initially high, NOR gate 510 will still provide a low when SAFE is high so inverter 512 will provide a high to maintain the desired high state of NOROUT. With one or more of IN1-IN4 low on power up and SAFE high, the output of NOR gate 510 will remain low so that inverter 512 tries to drive NOROUT high. However, the transistor 400 of the driver circuit which has a low input signal is sized to sink more current than inverter 512 can source, so NOROUT will remain low.

With SAFE provided in a low state after power up, the output of NOR gate 510 will be the inverse of NOROUT, so NOR gate 510 and inverter 512 will form a latch. By forming a latch NOR gate 510 and inverter 512 will provide stable operation after power up.

Unstable operation might occur after power up when NOROUT has been pulled high by current source 500, and transistor 502 has been off for some time because the inputs IN1–IN4 have not changed states from all being high. An unstable condition occurs because charge leakage will occur on the NOROUT line overtime, potentially causing the NOROUT line to transition to a low. However, with NOR gate 510 and inverter 512 forming a latch, such a latch will supply current to the NOROUT line when current leakage occurs to maintain the state of the NOROUT line high for a lengthy time if all inputs IN1–IN4 remain high.

Another failsafe feature is provided by inverter 420 and PMOS transistor 422 of FIG. 4. The inverter 420 and transistor 422 provide a safety feature if a glitch occurs when NOROUT is bumped up rapidly along with NORCNTRL after transistor 400 is turned off should transistor 410 never turn on sufficiently to reset latch 412,414. The inverter 420 functions to turn on transistor 422 when NOROUT is pulled high to reset the latch 412,414 even if transistor 410 fails to reset the latch 412,414.

VI. Input Buffer Configuration To Provide AND/NOR Gate Receiving More Inputs

Figure 6:
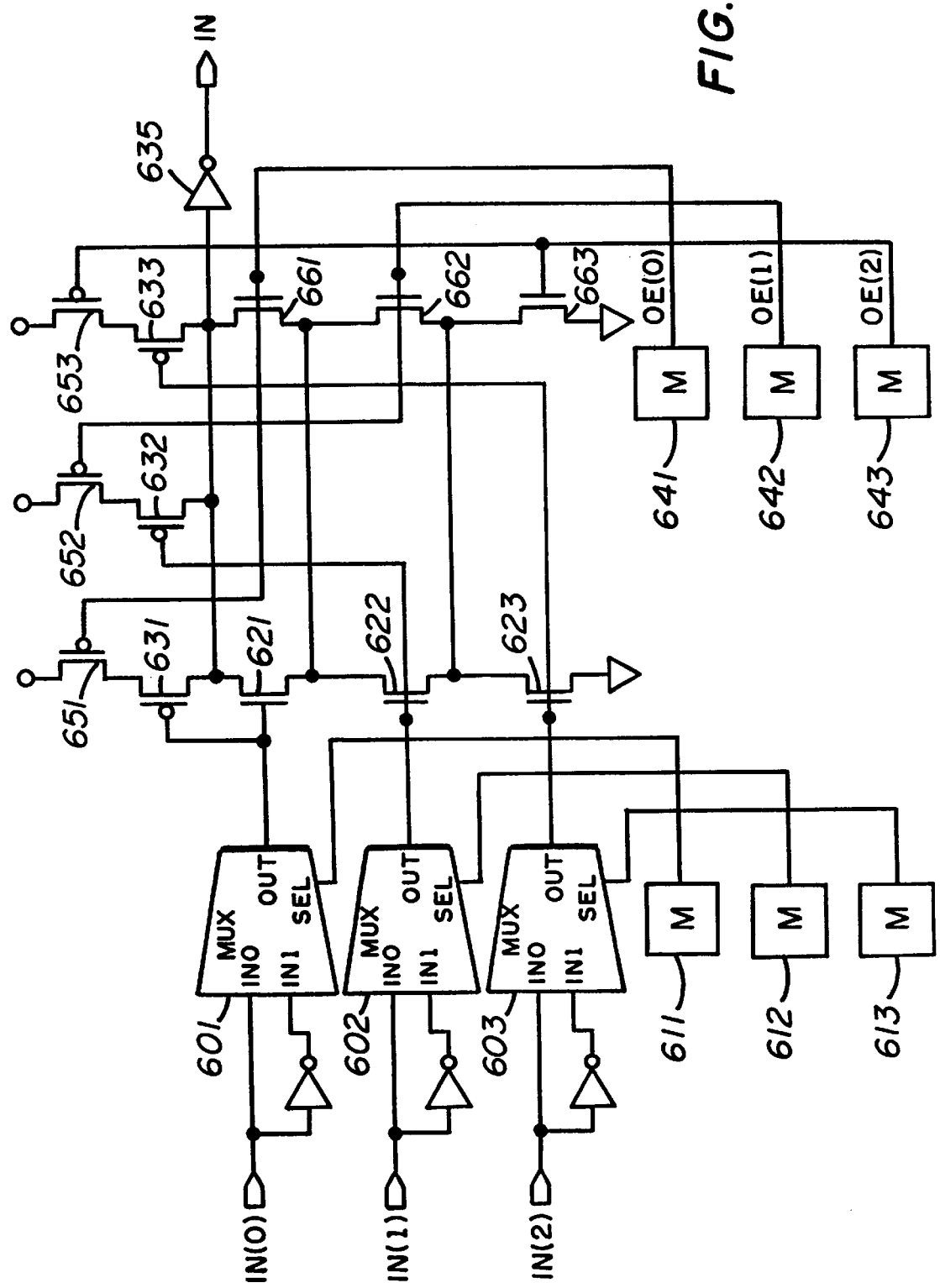
FIG. 6 shows circuitry to provide an even larger AND/NOR gate as provided in the IOB of an FPGA.

FIG. 6 shows a configuration for an input/output buffer (IOB) of an FPGA to enable an AND/NOR gate as configured in FIG. 3 to effectively AND or NOR more inputs using the same number of driver circuits. In other words, the circuitry of FIG. 6 when used in conjunction with the circuitry of FIG. 3 provides a wider decoding capability.

The circuit of FIG. 6 includes multiplexers 601–603. Inputs to multiplexers 601-603 are provided in the true and complement form from inputs IN(0)–IN(2). Because a NOR gate can be formed by an AND gate with inverted inputs, by selectively providing inputs IN(0)–IN(2) in a true and complement form, selection of a NOR gate or an AND gate is provided. Memory cells 611–613 provide polarity control. The memory cells 611–613 have outputs connected to the select inputs of multiplexers 601–603 to enable selection of a true or complement mode.

Outputs of multiplexers 601–603 are connected to respective NMOS pass gate transistors 621–623 which have source to drain paths connected in series, and to respective PMOS transistors 631–633 which have source to drain paths connected in parallel. The drains of transistors 631–633 are connected to the input of inverter 635. The drain of transistor 621 is also connected to the input of inverter 635. The output of inverter 635 provides the output of the circuit of FIG. 5 which is connectable to an input of one of the driver circuits 301–304 of FIG. 3.

The buffer further includes memory cells 641–643 to individually enable or disable selected ones of the inputs IN(0)–IN(2). The memory cells 641–643 are connected to the gates of PMOS transistors 651–653 which connect Vcc to the sources of transistors 631–633. The memory cells 641–643 are further connected to the gates of NMOS transistors 661–663 which have source to drain paths connected in parallel with respective transistors 621–623.

In operation, to enable one of inputs IN(0)–IN(2) a low is provided from its corresponding memory cell 641–643, while to disable one the inputs IN(0)–IN(2) a high is provided from its corresponding memory cell. Referring to cell 641 which controls IN(0), with 641 low PMOS transistor 651 will be on to connect Vcc to the source of transistor 621. Further, transistor 661 will be off. With cell 641 high, the PMOS transistor 651 will be off to remove Vcc from transistor 631. Further, transistor 661 will turn on to bypass transistor 621 so that drains of PMOS transistors 632 and 633 connect to the series connected transistors 622 and 623.

With the inputs IN(0)–IN(2) enabled, and true polarity selected for multiplexers 601–604, the circuit will function as an AND gate as follows. First assuming IN(0)–IN(2) are high, NMOS transistors 621–623 will all turn on to connect the input of inverter 635 to ground. PMOS transistors 631–633 will turn off. The output of inverter 635 will then be high, as desired for an AND gates with all high inputs. Second, we assume that IN(0) goes low, while IN(1)–IN(2) remain high. With IN(0) low, NMOS transistor 621 will cut off a path to ground from the input of inverter 635. Transistor 631 will also turn on to connect Vcc to the input of inverter 635. The output of inverter 635 will then go high, as desired for an AND gate with any one input being low. To create a NOR gate, polarity is selected so that multiplexers 601–603 provide the inverse of the signals IN(0)–IN(2).

Although the present invention has been described above with particularity, this was merely to teach one of ordinary skill in the art how to make and use the invention. Many additional modifications will fall within the scope of the invention, as that scope is defined by the claims which follow.

What is claimed is:

1. A logic gate comprising:
   a current switch circuit comprising:
   a first current source; and
   a current control transistor having a gate coupled to a NORCNTRL line and a source to drain path coupling the first current source to a NOROUT line, the NOROUT line providing an output of the logic gate;
   driver circuits each comprising:
   a pull down transistor having a source to drain path coupling the NOROUT line to Vss, and a gate coupled to receive a given one of a plurality of input signals for the logic gate ($IN_1$–$IN_N$); and
   a power control means coupled to the NORCNTRL line, and to receive the given input signal, the power control means enabling the NORCNTRL line to turn on the current control transistor for a predetermined period of time when the given one of the plurality of input signals is applied to turn off the pull down transistor, the power control means further enabling the NORCNTRL line to turn off the current control transistor after the period of time.

2. The logic gate of claim 1,
   wherein the current switch circuit further comprises:
   a buffer coupling the NORCNTRL line to the gate of the current control transistor; and
   a second current source coupled to the NORCNTRL line at an input to the buffer, and
   wherein the power control means in each of the driver circuits comprises:
   a first pass gate transistor having a source to drain path coupling the NORCNTRL line to the NOROUT line, and having a gate;
   a first logic gate having a first input coupled to receive the given one of the input signals, a second input coupled to the NORCNTRL line, and an output;
   a first latch having an input coupled to the output of the first logic gate, and having an output; and
   a second logic gate having a first input coupled to the output of the first latch, a second input coupled to receive the given one of the plurality of input signals, and an output coupled to the gate of the pass transistor;
   a first inverter coupling the given one of the plurality of input signals to the gate of the pull down transistor.

3. The logic gate of claim 2, wherein the power control means in each of the driver circuits further comprises:
   a first inverter coupling the given one of the plarality of input signals to the gate of the pull down transistor,
   wherein the first logic gate comprises a NOR gate, and the given one of the plurality of input signals is coupled to the second input of the first logic gate through the first inverter, wherein the second logic gate comprises a NAND gate, and wherein the pass gate comprises a PMOS transistor.

4. The logic gate of claim 3, wherein the power control means in each of the driver circuits further comprises:

an NMOS pass gate transistor having a source to drain path coupling the NORCNTRL line to the NOROUT line, and having a gate; and a second inverter coupling the output of the second logic gate to the gate of the NMOS pass gate transistor.

5. The logic gate of claim 2, wherein the first logic gate comprises:

an NMOS transistor having a gate coupled to the output of the first inverter, a source coupled to Vss, and a drain coupled to an input of the first latch;

a first PMOS transistor having a gate coupled to the output of the first inverter, a drain coupled to the input of the first latch, and having a source; and a second PMOS transistor having a gate coupled to the NORCNTRL line, a source coupled to Vdd, and a drain coupled to the source of the first PMOS transistor.

6. The logic gate of claim 5, wherein the power control means in each of the driver circuits further comprises:

a third PMOS transistor having a source to drain path coupling Vdd to the input of the first latch, and having a gate; and a third inverter having an input connected to the NOROUT line, and an output coupled to the gate of the third PMOS transistor.

7. The logic gate of claim 2, wherein the buffer comprises two series connected inverters.

8. The logic gate of claim 1, wherein the current switch circuit further comprises:

a second latch having one end coupled to the NOROUT line.

9. The logic gate of claim 8, wherein the logic gate receives a power up control signal in a first state for a predetermined period of time when the circuit containing the logic gate is turned on, and wherein the latch comprises:

a third logic gate having a first input receiving the power up control signal, a second input coupled to the NOROUT line, and an output; and an inverter having an input coupled to the output of the third logic gate and an output coupled to the NOROUT line.

10. The logic gate of claim 9, wherein the third logic gate comprises a NOR gate.

11. The logic gate of claim 1, wherein the pull down transistor in each of the driver circuits sinks more current than the first current source sources.

12. The logic gate of claim 2, wherein the pull down transistor in each of the driver circuits sinks more current than the first current source and the second current source together source.

13. A logic gate comprising:

a current switch circuit comprising:

a first current source; and a current control transistor having a source to drain path coupling the first current source to a NOROUT line, the NOROUT line providing an output of the logic gate;

a buffer having an input coupled to a NORCNTL line, and an output coupled to the gate of the current control transistor; and a second current source coupled to the NORCNTRL line at an input to the buffer; and a driver circuits each comprising:

a pull down transistor having a source to drain path coupling the NOROUT line to Vss, and a gate coupled to receive a given one of a plurality of input signals for the logic gate ($IN_1$–$IN_N$);

a first pass gate transistor having a source to drain path coupling the NORCNTRL line to the NOROUT line, and having a gate;

a first logic gate having a first input coupled to receive the given one of the plarality of input signals, a second input coupled to the NORCNTRL line, and an output;

a first latch having an input coupled to the output of the first logic gate, and having an output; and a second logic gate having a first input coupled to the output of the first latch, a second input coupled to receive the given one of the plarality of input signals, and an output coupled to the gate of the pass transistor.

14. The logic gate of claim 13, wherein each of the driver circuits further comprise:

a first inverter coupling the given one of the plarality of input signals to the gate of the pull down transistor, wherein the first logic gate comprises a NOR gate, and the given one of the plurality of input signals is coupled to the second input of the first logic gate through the first inverter, wherein the second logic gate comprises a NAND gate, and wherein the pass gate comprises a PMOS transistor.

15. The logic gate of claim 14, wherein each of the driver circuits further comprise: p1 an NMOS pass gate transistor having a source to drain path coupling the NORCNTRL line to the NOROUT line, and having a gate; and a second inverter coupling the output of the second logic gate to the gate of the NMOS pass gate transistor.

16. The logic gate of claim 14, wherein the first logic gate comprises:

an NMOS transistor having a gate coupled to the output of the first inverter, a source coupled to Vss, and a drain coupled to an input of the first latch;

a first PMOS transistor having a gate coupled to the output of the first inverter, a drain coupled to the input of the first latch, and having a source; and a second PMOS transistor having a gate coupled to the NORCNTRL line, a source coupled to Vdd, and a drain coupled to the source of the first PMOS transistor.

17. The logic gate of claim 16, wherein each of the driver circuits further comprise:

a third PMOS transistor having a source to drain path coupling Vdd to the input of the first latch, and having a gate; and a third inverter having an input connected to the NOROUT line, and an output coupled to the gate of the third PMOS transistor.

18. The logic gate of claim 13, wherein the buffer comprises two series connected inverters.

19. The logic gate of claim 13, wherein the current switch circuit further comprises:

a second latch having one end coupled to the NOROUT line.

20. The logic gate of claim 19, wherein the logic gate receives a power up control signal in a first state for a predetermined period of time when the circuit containing the logic gate is turned on, and wherein the latch comprises:

a third logic gate having a first input receiving the power up control signal, a second input coupled to the NOROUT line, and an output; and an inverter having an input coupled to the output of the third logic gate and an output coupled to the NOROUT line.

21. The logic gate of claim 20, wherein the third logic gate comprises a NOR gate.

22. The logic gate of claim 13, wherein the pull down transistor in each of the driver circuits sinks more current than the first current source and the second current source together source.

* * * * *